US012512845B2

United States Patent
Chen et al.

(12) United States Patent
(10) Patent No.: US 12,512,845 B2
(45) Date of Patent: Dec. 30, 2025

(54) HIGH-ORDER NOISE-SHAPING SUCCESSIVE APPROXIMATION REGISTER (SAR) ANALOG-TO-DIGITAL CONVERTER AND METHOD THEREOF

(71) Applicants: UPBEAT TECHNOLOGY Co., Ltd, New Taipei (TW); NCKU RESEARCH & DEVELOPMENT FOUNDATION, Tainan (TW)

(72) Inventors: Chung-Chieh Chen, New Taipei (TW); Shuo-Hong Hung, New Taipei (TW); Kai-Cheng Cheng, Tainan (TW); Soon-Jyh Chang, Tainan (TW)

(73) Assignees: UPBEAT TECHNOLOGY CO., LTD, New Taipei (TW); NCKU RESEARCH & DEVELOPMENT FOUNDATION, Tainan (TW)

( * ) Notice: Subject to any disclaimer, the term of this patent is extended or adjusted under 35 U.S.C. 154(b) by 133 days.

(21) Appl. No.: 18/524,957

(22) Filed: Nov. 30, 2023

(65) Prior Publication Data
US 2024/0396564 A1    Nov. 28, 2024

Related U.S. Application Data

(60) Provisional application No. 63/468,295, filed on May 23, 2023.

(51) Int. Cl.
*H03M 1/06*    (2006.01)

(52) U.S. Cl.
CPC ................... *H03M 1/0604* (2013.01)

(58) Field of Classification Search
CPC .................. H03M 1/468; H03M 1/0604
See application file for complete search history.

(56) References Cited

U.S. PATENT DOCUMENTS

| 7,411,534 B1 * | 8/2008 | Melanson | H03M 3/332 |
| | | | 341/131 |
| 9,425,818 B1 * | 8/2016 | Rajaee | H03M 3/32 |
| 10,784,883 B1 * | 9/2020 | Tripathi | H03M 1/442 |

(Continued)

OTHER PUBLICATIONS

Office Action issued by Taiwan Intellectual Property Office on Sep. 5, 2024.

(Continued)

*Primary Examiner* — Lam T Mai
(74) *Attorney, Agent, or Firm* — WPAT, PC (57) ABSTRACT

A Successive Approximation Register Analog-to-Digital Converter (SAR ADC) comprises: a plurality of switch capacitor arrays, used to sample an analog input signal; a noise shaping circuit including a fourth-order CIFF (Cascade of Integrators with Feed-Forward) loop filter having two second-order cascaded CIFF loop filters, in the fourth-order CIFF loop filter, a first-order extraction capacitor and a second-order extraction capacitor sharing a first amplifier, and a third-order extraction capacitor and a fourth-order extraction capacitor sharing a second amplifier; a comparator for comparing a plurality of output signals from the noise shaping circuit to produce a plurality of comparison results; and a logic circuit for generating a digital output signal and controlling the switch capacitor arrays based on comparison results from the comparator.

12 Claims, 7 Drawing Sheets

(56) References Cited

U.S. PATENT DOCUMENTS

| | | | | |
|---|---|---|---|---|
| 10,790,843 | B2* | 9/2020 | Huang | H03M 3/426 |
| 10,862,497 | B1* | 12/2020 | Lin | H03M 1/1245 |
| 10,951,225 | B1* | 3/2021 | Shannon | H03M 1/462 |
| 11,424,754 | B1* | 8/2022 | Berens | H03M 1/1057 |
| 11,522,556 | B1* | 12/2022 | Sheikholeslami | H03M 3/426 |
| 11,705,920 | B2* | 7/2023 | Sun | H03M 1/0854 |
| | | | | 341/161 |
| 2012/0146830 | A1* | 6/2012 | Jeon | H03M 1/164 |
| | | | | 341/172 |
| 2017/0126239 | A1* | 5/2017 | Sun | H03M 1/46 |
| 2018/0069564 | A1* | 3/2018 | Liu | H03M 3/46 |
| 2018/0309458 | A1* | 10/2018 | Bandyopadhyay | H03M 1/804 |
| 2020/0195269 | A1* | 6/2020 | Lei | H03M 1/468 |
| 2023/0065453 | A1 | 3/2023 | Bandyopadhyay et al. | |

OTHER PUBLICATIONS

Schreier et al. "Understanding Delta-Sigma Data Converters", 2017, Wiley-Interscience, IEEE Press.

Jie et al. "An Overview of Noise-Shaping SAR ADC: From Fundamentals to the Frontier", IEEE Open Journal of the Solid-State Circuits Society, vol. 1, pp. 149-161, 2021, doi: 10.1109/OJSSCS.2021.3119910.

Jie et al. "A Cascaded Noise-shaping SAR Architecture for robust order extension", IEEE Journal of Solid-State Circuits, vol. 55, No. 12, pp. 3236-3247, Dec. 2020, doi: 0.1109/JSSC.2020.3019487.

Wang et al. "27.3 A 13.8-ENOB 0.4pF-CIN 3rd-Order Noise-Shaping SAR in a Single-Amplifier EF-CIFF Structure with Fully Dynamic Hardware-Reusing KT/C Noise Cancelation," T. 2021 IEEE International Solid-State Circuits Conference (ISSCC), 2021, pp. 374-376, doi: 10.1109/ISSCC42613.2021.9365990.

Liu et al. "27.1 A 250kHz-BW 93dB-SNDR 4th-Order Noise-Shaping SAR Using Capacitor Stacking and Dynamic Buffering,", 2021 IEEE International Solid-State Circuits Conference (ISSCC).

Tsai et al. "A 1-V, 8b, 40MS/s, 113µW Charge-Recycling SAR ADC with a 14µW Asynchronous Controller,", IEEE Symp. VLSI Circuits (SOVC) Dig. Tech. Papers, Jun. 2011, pp. 264-265.

Ogawa et al. "SAR ADC algorithm with redundancy,", APCCAS 2008—2008 IEEE Asia Pacific Conference on Circuits and Systems, 2008, pp. 268-271.

Liu et al. "A 10b 100MS/s 1.13mW SAR ADC with binary scaled error compensation,", IEEE ISSCC Dig. Tech. Papers, Feb. 2010, pp. 386-387.

Chen et al. "All-Digital Calibration Algorithms to Correct for Static Non-Linearities in ADCs,", 2020 IEEE International Symposium on Circuits and Systems (ISCAS), 2020, pp. 1-5, doi: 10.1109/ISCAS45731.2020.9180833.

* cited by examiner

HIGH-ORDER NOISE-SHAPING SUCCESSIVE APPROXIMATION REGISTER (SAR) ANALOG-TO-DIGITAL CONVERTER AND METHOD THEREOF

This application claims the benefit of U.S. provisional patent application Ser. No. 63/468,295, filed May 23, 2023, the disclosure of which is incorporated by reference herein in its entirety.

TECHNICAL FIELD

The disclosure relates in general to a high order noise shaping Successive-approximation register Analog-to-digital converter (SAR ADC) having dynamic amplifiers and method thereof.

BACKGROUND

An Analog-to-Digital Converter (ADC) serves as the interface circuit between analog sensors and Digital Signal Processing (DSP) circuits, allowing the conversion of real-world analog signals into digital signals used in digital systems.

With technological advancements, the specifications required for ADCs have become increasingly challenging to meet. For instance, audio codecs in wearable devices and Internet of Things (IoT) sensor nodes demand low-cost, low-power ADCs with a Signal-to-Noise Ratio (SNR) exceeding 100 dB. In traditional ADC architectures, the Successive-approximation register Analog-to-digital converter (SAR ADC) is considered a good choice for its simplicity and digital implementation, meeting the low-power requirements. However, at high resolutions (e.g., above 11-bit resolution), SAR ADC loses its power efficiency advantage due to the comparator noise requirements and the area demands of a large capacitor array, typically found in Capacitor Digital Analog Converters (CDAC).

Noise shaping SAR ADC combines the high-resolution advantages of Delta Sigma Modulator ADC (DSM ADC) with the low-power and process evolution advantages of SAR ADC. This creates a new ADC architecture that not only shapes quantization error and comparator noise without the need for power-consuming operational amplifiers but also achieves higher SNR. Noise shaping SAR ADC achieves this by establishing a loop filter in the traditional SAR ADC, shaping quantization noise and comparator noise, and then using a digital low-pass filter to eliminate high-frequency noise.

However, the existing Noise Shaping SAR ADCs still have high power consumption, and the loop filter achieves only low-order noise shaping effects. To achieve good power efficiency and higher-order noise shaping, a dynamic amplifier has been proposed in the filtering implementation. These structures mostly revolve around two major architectures: Cascade of Integrators with Feed-Forward (CIFF) and Error Feedback (EF). The EF architecture is easy to implement, but compared to CIFF, the EF architecture is more sensitive to Process, Voltage, and Temperature (PVT) variations. As the order increases, the CIFF architecture requires more amplifiers, leading to increased power consumption.

Therefore, a trade-off is needed between PVT robustness, order, and power consumption when implementing high-order noise shaping.

In Noise Shaping SAR ADCs, the main challenge is to ensure that the Noise Transfer Function (NTF) is insensitive to PVT, and even with an increase in order, the power consumption remains low, all while maintaining a simple structure without complex timing and switching circuits.

This disclosure introduces a high-order noise shaping SAR ADC that achieves good power efficiency, provides PVT robustness, and achieves high-order noise shaping effects.

SUMMARY

One of the objectives of the present invention is to provide a high-order Noise Shaping (NS) SAR ADC. The ADC can utilize two amplifiers to implement a Cascade of Integrators with Feed-Forward (CIFF) structure having 4th-order noise transfer function. The high-order NS SAR ADC in the embodiments of this disclosure features advantages such as a simple structure, concise timing, and low power consumption.

According to one embodiment, a successive approximation register analog-to-digital converter is provided. The successive approximation register analog-to-digital converter comprises: a plurality of switch capacitor arrays for acquiring or sampling an analog input signal; a noise shaping circuit coupled to said switch capacitor arrays, said noise shaping circuit comprising a multi-order Cascade of Integrators with Feed-Forward (CIFF) circuit having a plurality of amplifiers, a plurality of integration capacitors, and a plurality of extraction capacitors; a comparator coupled to said noise shaping circuit, said comparator for comparing a plurality of output signals of said noise shaping circuit to generate a plurality of comparison results; and a logic circuit coupled to said switch capacitor arrays and said comparator, said logic circuit generating a digital output signal and controlling said switch capacitor arrays based on said comparison results.

In one embodiment of the application, said multi-order CIFF circuit is a fourth-order CIFF circuit having two cascaded second-order CIFF circuits.

In one embodiment of the application, a first switch capacitor array of said switch capacitor arrays comprises a plurality of first capacitors, a plurality of first switches, and a first multiplexer group; a second switch capacitor array of said switch capacitor arrays comprises a plurality of second capacitors, a plurality of second switches, and a second multiplexer group; said first capacitors and said second capacitors are coupled in series to said first switches and said second switches, respectively; said first switches and said second switches selectively input the analog input signal or a plurality of output signals of said first and second multiplexer groups into said first and second capacitors, respectively; and each of said first and second multiplexer groups comprises a plurality of multiplexers, said first and second multiplexer groups selecting from a first reference voltage, a second reference voltage, and a common-mode voltage to output to said first and second switches.

In one embodiment of the application, said noise shaping circuit comprises a plurality of first integration capacitors, a plurality of second integration capacitors, a plurality of first extraction capacitors, a plurality of second extraction capacitors, and first and second amplifiers; said first integration capacitors are in series; said second integration capacitors are in series; and said first extraction capacitors are selectively coupled between a positive output terminal and a negative output terminal of said first amplifier, and said second extraction capacitors are selectively coupled between a positive output terminal and a negative output terminal of said second amplifier.

In one embodiment of the application, in a sampling phase, the analog input signal is sampled to a plurality of lower plates of said first and second switch capacitor arrays; and a portion of said first integration capacitors and a portion of said second integration capacitors are reset.

In one embodiment of the application, during a conversion phase, the comparator performs a plurality of comparison processes; in a sharing phase, said first and second extraction capacitors are coupled in parallel to said first and second integration capacitors, and charge redistribution is performed, with the conversion phase and the sharing phase occurring simultaneously; in the comparison processes, a plurality of output signals of said first and second switch capacitor arrays enter said noise shaping circuit and are added to said first and second integration capacitors; and the comparator compares a first sum and a second sum, where the first sum is obtained by adding a first analog input signal of the analog input signal to a plurality of first integration voltages of the first integration capacitors, and the second sum is obtained by adding a second analog input signal of the analog input signal to a plurality of second integration voltages of the second integration capacitors.

In one embodiment of the application, in an extraction phase, a voltage of a first part of said first integration capacitors and a voltage of a first part of said second integration capacitors are amplified by said first amplifier and stored on said first extraction capacitors; and a voltage of a second part of said first integration capacitors and a voltage of a second part of said second integration capacitors are amplified by said second amplifier and stored on said second extraction capacitors.

According to one embodiment, a successive approximation register analog-to-digital converter is provided. The successive approximation register analog-to-digital converter comprises: a plurality of switch capacitor arrays for acquiring an analog input signal; a noise shaping circuit comprising a fourth-order CIFF loop filter having two second-order cascaded CIFF loop filters, wherein in the fourth-order CIFF loop filter, a first order extraction capacitor and a second order extraction capacitor share a first amplifier, and a third order extraction capacitor and a fourth order extraction capacitor share a second amplifier; a comparator, two input terminals of the comparator respectively coupled to a plurality of integration capacitors of the fourth-order CIFF loop filter, the comparator comparing a plurality of output signals of the noise shaping circuit to generate a plurality of comparison results, the noise shaping circuit being positioned after said switch capacitor arrays and before said comparator; and a logic circuit, an output terminal of the comparator coupled to an input terminal of the logic circuit, three output terminals of the logic circuit respectively coupled to said switch capacitor arrays for generating a digital output signal, and the logic circuit generating the digital output signal based on the comparison results of said comparator to control said switch capacitor arrays.

In one embodiment of the application, in a sampling phase, the analog input signal is sampled to a plurality of lower plates of said switch capacitor arrays; and a portion of said plurality of integration capacitors of the fourth-order CIFF loop filter are reset.

In one embodiment of the application, in a conversion phase, the comparator performs comparisons; in a sharing phase, said first order extraction capacitor, said second order extraction capacitor, said third order extraction capacitor, and said fourth order extraction capacitor are coupled in parallel to said plurality of integration capacitors of the fourth-order CIFF loop filter for performing charge sharing and redistribution, wherein the conversion phase and the sharing phase occurring simultaneously; the analog input signal sampled by the plurality of lower plates of said switch capacitor arrays is pushed to a plurality of upper plates of said switch capacitor arrays; in the conversion phase, the comparator performs comparisons, and the logic circuit controls said switch capacitor arrays; after the conversion phase ends, a plurality of voltages of the plurality of upper plates of said switch capacitor arrays is a residual voltage after the conversion phase; a noise transfer function of the fourth-order CIFF loop filter is determined by a capacitance ratio of said plurality of integration capacitors and amplification ratios of the first and second amplifiers; and when a comparison number of the comparator reaches a bit number of the successive approximation register analog-to-digital converter, the conversion phase ends, and the logic circuit outputs the digital output signal.

In one embodiment of the application, in an extraction phase, the noise shaping circuit uses said first and second amplifiers and said plurality of integration capacitors to amplify a plurality of integration voltages of said plurality of integration capacitors by a gain factor, and extracts a processing result to said first order extraction capacitor, said second order extraction capacitor, said third order extraction capacitor, and said fourth order extraction capacitor.

According to another embodiment, a method for successive approximation register analog-to-digital conversion method is provided. The method for successive approximation register analog-to-digital conversion comprises: in a sampling phase, sampling an analog input signal to a plurality of lower plates of a first and a second switch capacitor arrays, and resetting a portion of a plurality of first integration capacitors and a portion of a plurality of second integration capacitors of a fourth-order CIFF loop filter; in a conversion phase, performing a plurality of comparison processes by a comparator; in a sharing phase, coupling a plurality of first extraction capacitors and a plurality of second extraction capacitors of the fourth-order CIFF loop filter in parallel to the first integration capacitors and the second integration capacitors for charge redistribution, wherein the conversion phase and the sharing phase occurring simultaneously; in the comparison processes, adding a plurality of output signals of the first and second switch capacitor arrays to the first and the second integration capacitors, comparing a plurality of summing having a plurality of integration voltages of the first and the second integration capacitors and a plurality of input signals by the comparator; and in an extraction phase, amplifying the integration voltages of the plurality of first integration capacitors and the plurality of second integration capacitors using a first and a second amplifier, and storing on the first and the second extraction capacitors.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

The following describes an embodiment of the present disclosure. Examples of the embodiment are illustrated in the figures, where identical or similar reference numerals indicate identical or similar components or components with similar functions. The embodiments described below are exemplary, intended to explain the disclosure, but should not be interpreted as limiting the disclosure. Reference will be made to the drawings to describe an embodiment of a SAR ADC with dynamic noise shaping as described in the present disclosure.

Figure 1:
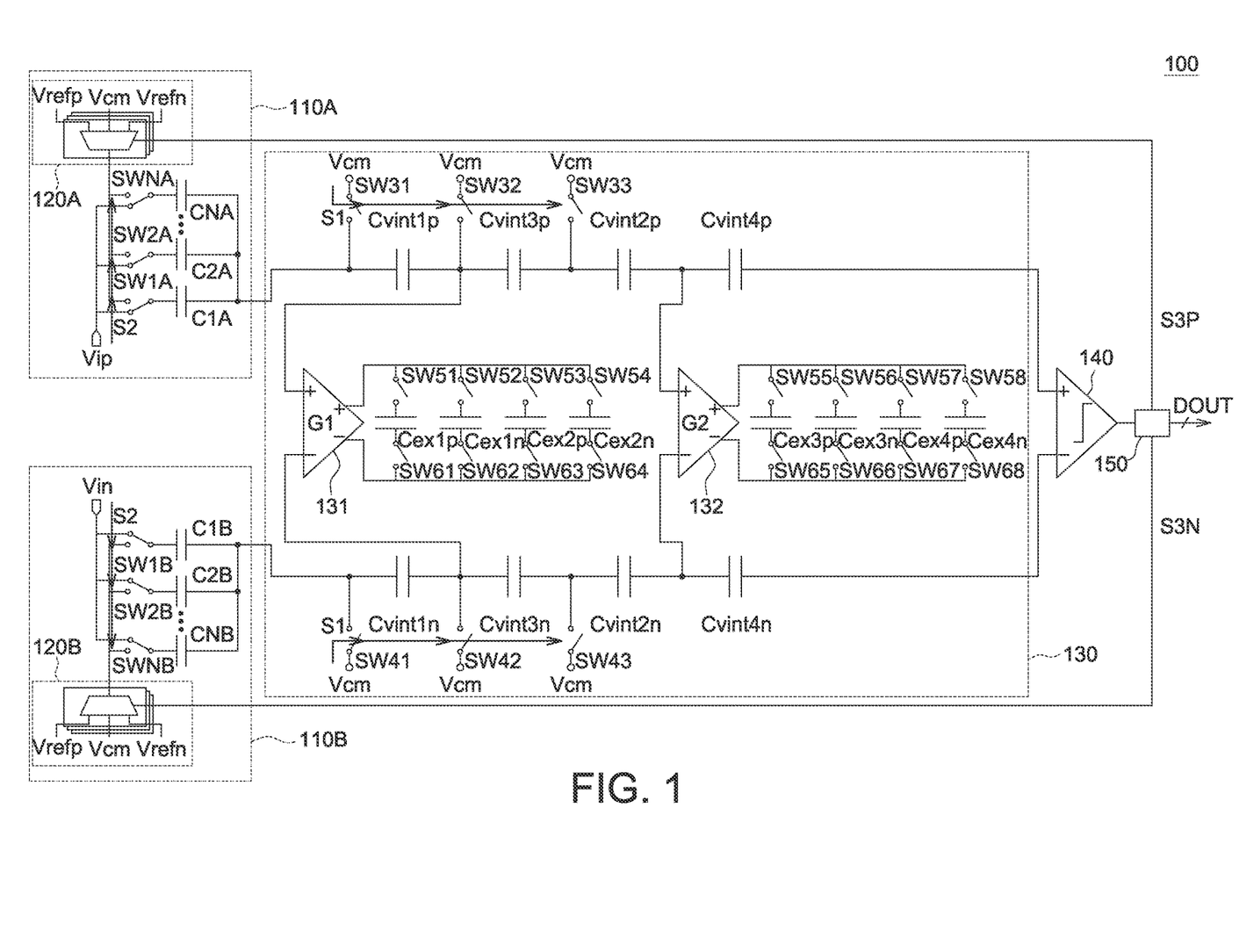
FIG. 1 illustrates a noise shaping SAR ADC according to one embodiment of the present disclosure.

FIG. 1 illustrates a noise shaping SAR ADC 100 according to one embodiment of the present disclosure. As shown in FIG. 1, the noise shaping SAR ADC 100 includes: switch capacitor arrays 110A and 110B, a noise shaping circuit 130, a comparator 140, and a logic circuit 150. The digital output signal DOUT is generated by the logic circuit 150. In this example, but not limited to, the digital output signal DOUT is 11 bits, including bits D1-D11.

The input terminals of the switch capacitor arrays 110A and 110B respectively receive analog input signals Vip and Vin. The switch capacitor array 110A includes a plurality of capacitors C1A-CNA (N is a positive integer) (also referred to as a plurality of first capacitors), a plurality of switches SW1A-SWNA (also referred to as a plurality of first switches), and a multiplexer group 120A. The switch capacitor array 110B includes a plurality of capacitors C1B-CNB (also referred to as a plurality of second capacitors), a plurality of switches SW1B-SWNB (also referred to as a plurality of second switches), and a multiplexer group 120B.

These capacitors C1A-CNA and C1B-CNB are coupled in series with the switches SW1A-SWNA and SW1B-SWNB, respectively. The switches SW1A-SWNA and SW1B-SWNB are controlled by a control signal S2 to select whether to the input analog input signals Vip and Vin or the output signals of the multiplexer groups 120A and 120B into these capacitors C1A-CNA and C1B-CNB.

The multiplexer groups 120A and 120B are controlled by control signals S3P and S3N generated by logic circuit 150.

Each of the multiplexer groups 120A and 120B includes a plurality of multiplexers. For example, in the case of an 11-bit SAR ADC, each of the multiplexer groups 120A and 120B includes 11 multiplexers, each controlled by the control signals S3P and S3N. The multiplexers in the multiplexer groups 120A and 120B select from reference voltages Vrefp, Vrefn, and a common-mode voltage Vcm according to the control signals S3P and S3N to output to the switches SW1A-SWNA and SW1B-SWNB of the switch capacitor arrays 110A and 110B.

In one embodiment of the present disclosure, the noise shaping circuit 130 is a dynamic integral network, with its input terminals coupled to the output terminals of the switch capacitor arrays 110A and 110B to obtain the output signals of the switch capacitor arrays 110A and 110B. The dynamic integral network is composed of two dynamic integrators, and a plurality of dynamic integrators can be reconfigured into different circuit forms.

In one embodiment of the present disclosure, the noise shaping circuit 130 includes a 4th-order Cascade of Integrators with Feed-Forward (CIFF) circuit, but not limited to.

The noise shaping circuit 130 includes a plurality of integration capacitors $Cvint1p$, $Cvint2p$, $Cvint3p$, $Cvint4p$, $Cvint1n$, $Cvint2n$, $Cvint3n$, and $Cvint4n$ (where $Cvint1p$, $Cvint2p$, $Cvint3p$, $Cvint4p$ can also be referred to as the first integration capacitors, and $Cvint1n$, $Cvint2n$, $Cvint3n$, $Cvint4n$ can also be referred to as the second integration capacitors); a plurality of extraction capacitors $Cex1p$, $Cex2p$, $Cex3p$, $Cex4p$, $Cex1n$, $Cex2n$, $Cex3n$, and $Cex4n$ (where $Cex1p$, $Cex2p$, $Cex1n$, $Cex2n$ can also be referred to as the first extraction capacitors, and $Cex3p$, $Cex4p$, $Cex3n$, $Cex4n$ can also be referred to as the second extraction capacitors); a plurality of switches SW31-SW68; amplifiers 131 and 132. The gain of amplifiers 131 and 132 is denoted as G1 and G2, respectively. The switches SW31-SW43 are controlled by a control signal S1.

As mentioned above, the noise shaping circuit 130 includes a 4th-order CIFF circuit, which further includes two cascaded 2nd-order CIFF circuits. One 2nd-order CIFF circuit mainly includes integration capacitors $Cvint1p$, $Cvint2p$, $Cvint1n$, and $Cvint2n$; extraction capacitors $Cex1p$, $Cex2p$, $Cex1n$, and $Cex2n$; switches SW51-SW54, SW61-SW64; and an amplifier 131. The other 2nd-order CIFF circuit mainly includes integration capacitors $Cvint3p$, $Cvint4p$, $Cvint3n$, and $Cvint4n$; extraction capacitors $Cex3p$, $Cex4p$, $Cex3n$, and $Cex4n$; switches SW55-SW58, SW65-SW68; and an amplifier 132.

The integration capacitors $Cvint1p$, $Cvint2p$, $Cvint3p$, $Cvint4p$ are coupled in series, as well as the integration capacitors $Cvint1n$, $Cvint2n$, $Cvint3n$, $Cvint4n$.

Terminals of the switches SW31-SW33 is coupled to terminals of the integration capacitors $Cvint1p$, $Cvint2p$, $Cvint3p$, and the other terminals of the switches SW31-SW33 receives the common-mode voltage Vcm.

Terminals of the switches SW41-SW43 is coupled to terminals of the integration capacitors $Cvint1n$, $Cvint2n$, $Cvint3n$, and the other terminals of the switches SW41-SW43 receives the common-mode voltage Vcm.

The extraction capacitors $Cex1p$, $Cex2p$, $Cex1n$, $Cex2n$ are selectively coupled to the output terminal of the amplifier 131, and the extraction capacitors $Cex3p$, $Cex4p$, $Cex3n$, $Cex4n$ are selectively coupled to the output terminal of the amplifier 132.

In addition, in the sharing stage PSH (to be described later), the extraction capacitors $Cex1p$, $Cex2p$, $Cex3p$, $Cex4p$ are coupled in parallel to the integration capacitors $Cvint1p$, $Cvint2p$, $Cvint3p$, $Cvint4p$, and the extraction capacitors Cex1n, Cex2n, Cex3n, Cex4n are coupled in parallel to the integration capacitors Cvint1n, Cvint2n, Cvint3n, Cvint4n.

The switches SW51-SW54 are coupled between the positive output terminal of the amplifier 131 and the extraction capacitors Cex1p, Cex1n, Cex2p, Cex2n. Similarly, the switches SW61-SW64 are coupled between the negative output terminal of the amplifier 131 and the extraction capacitors Cex1p, Cex1n, Cex2p, Cex2n.

The switches SW55-SW58 are coupled between the positive output terminal of the amplifier 132 and the extraction capacitors Cex3p, Cex3n, Cex4p, Cex4n. Similarly, the switches SW65-SW68 are coupled between the negative output terminal of the amplifier 132 and the extraction capacitors Cex3p, Cex3n, Cex4p, Cex4n.

The positive input terminal of the amplifier 131 is coupled to the junction of the capacitors Cvint1p and Cvint3p; the negative input terminal of the amplifier 131 is coupled to the junction of capacitors the Cvint1n and Cvint3n; the positive output terminal of the amplifier 131 is coupled to the switches SW51-SW54; and the negative output terminal of the amplifier 131 is coupled to the switches SW61-SW64.

The positive input terminal of the amplifier 132 is coupled to the junction of the capacitors Cvint2p and Cvint4p; the negative input terminal of the amplifier 132 is coupled to the junction of the capacitors Cvint2n and Cvint4n; the positive output terminal of the amplifier 132 is coupled to the switches SW55-SW58; and the negative output terminal of the amplifier 132 is coupled to the switches SW65-SW68.

In one embodiment of the present disclosure, the noise shaping circuit 130 is a fully differential 4th-order integrator having two dynamic amplifiers (131/132) and integration capacitors. The input of the noise shaping circuit 130 (4th-order integrator) is coupled to the output of the switch capacitor arrays (110A/110B). The output of the noise shaping circuit 130 (4th-order integrator) is coupled to the input of the comparator 140. The noise shaping circuit 130 (4th-order integrator) includes dynamic amplifiers 131 and 132; a plurality of integration capacitors (Cint1p, Cint2p, Cint3p, Cint4p, Cint1n, Cint2n, Cint3n, and Cint4n) for obtaining integration voltages (Vint1p, Vint2p, Vint3p, Vint4p, Vint1n, Vint2n, Vint3n, and Vint4n); and a plurality of extraction capacitors (Cex1p, Cex2p, Cex3p, Cex4p, Cex1n, Cex2n, Cex3n, and Cex4n) for obtaining extraction voltages (Vex1p, Vex2p, Vex3p, Vex4p, Vex1n, Vex2n, Vex3n, and Vex4n).

The positive input of the first amplifier (131) is coupled to the integration capacitors Cint1p and Cint3p. The output of the first amplifier (131) is coupled to the extraction capacitors Cex1p, Cex2p, Cex1n, and Cex2n through switches.

The positive input of the second amplifier (132) is coupled to the integration capacitors Cint2p and Cint4p. The output of the second amplifier (132) is coupled to the extraction capacitors Cex3p, Cex3p, Cex4n, and Cex4n through switches. The inputs of the integration capacitors Cint1p and Cint1n are coupled to the output of the switch capacitor arrays (110A and 110B). The inputs of the integration capacitors Cint3p and Cint3n are coupled to the output of the integration capacitors Cint1p and Cint1n. The inputs of the integration capacitors Cint2p and Cint2n are coupled to the output of the integration capacitors Cint3p and Cint3n. The inputs of the integration capacitors Cint4p and Cint4n are coupled to the output of the integration capacitors Cint2p and Cint2n. The outputs of the integration capacitors Cint4p and Cint4n are coupled to the input of the comparator 140.

The comparator 140 includes: two input terminals coupled to the two output terminals of the noise shaping circuit 130, and one output terminal coupled to the input terminal of the logic circuit 150. The comparator 140 is configured to compare the two output signals of the noise shaping circuit 130 and output the comparison result to the logic circuit 150. The comparator 140 is controlled by the control signal COMP.

The logic circuit 150 has three output terminals. Two of the three output terminals of the logic circuit 150 are respectively coupled to the input terminals of the switch capacitor arrays 110A and 110B, and the other one output terminal of the logic circuit 150 outputs the digital output signal DOUT. The logic circuit 150 is configured to output the digital output signal DOUT based on the comparison result of the comparator 140 and processes the comparison result of the comparator 140 to obtain control signals S3P and S3N, which control the output voltages of the switch capacitor arrays 110A and 110B.

Figure 2:
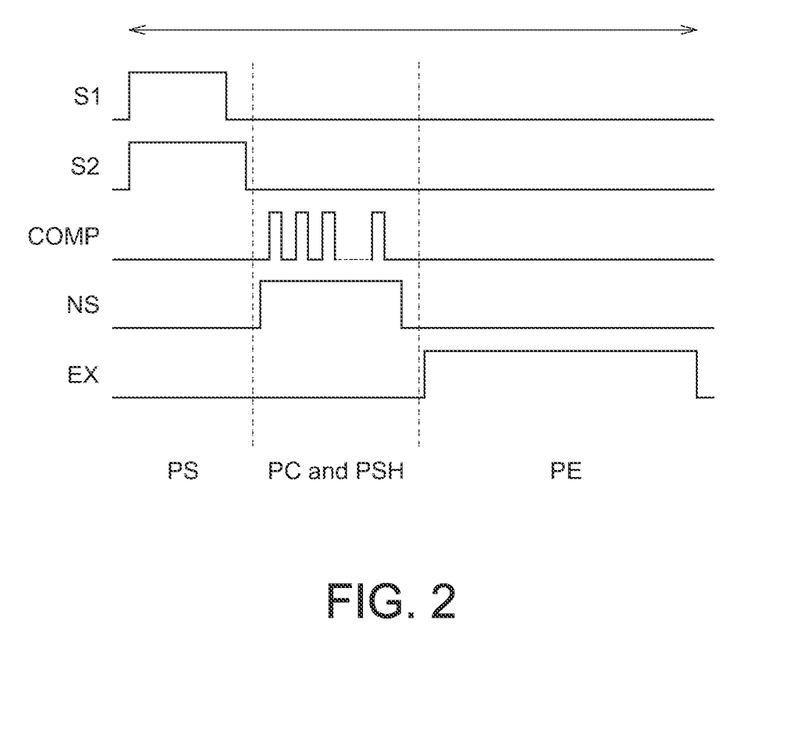
FIG. 2 shows a signal waveform diagram of the SAR ADC according to one embodiment of the present disclosure.

FIG. 2 shows a signal waveform diagram of the SAR ADC 100 according to one embodiment of the present disclosure. In FIG. 2, PS represents the sampling stage, PC represents the conversion stage (or quantization stage), PSH represents the sharing stage (or voltage redistribution stage), and PE represents the extraction stage (or residue extraction stage). The conversion stage PC and the sharing stage PSH are performed simultaneously. Moreover, the conversion stage PC includes a plurality of comparison processes.

Figure 3:
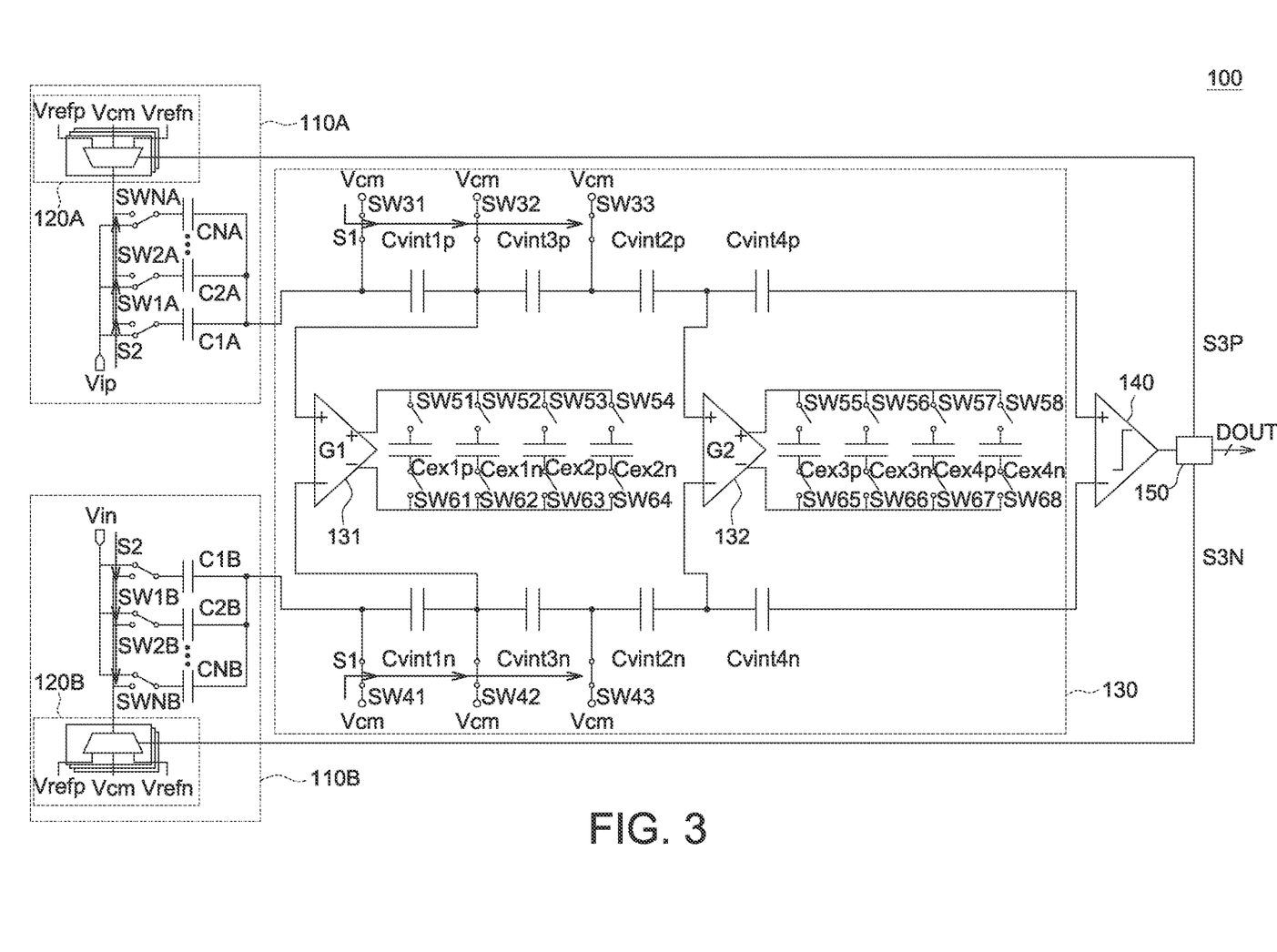
FIG. 3 shows an operational schematic diagram of the SAR ADC according to one embodiment of the present disclosure in the sampling stage.

FIG. 3 shows an operational schematic diagram of the SAR ADC 100 according to one embodiment of the present disclosure in the sampling stage PS. In the sampling stage PS, the switch capacitor arrays 110A and 110B acquire the analog input signals Vip and Vin.

In the sampling stage PS, under the control of the control signal S2, the switches SW1A-SWNA and SW1B-SWNB select to route the analog input signals Vip and Vin to the capacitors C1A-CNA and C1B-CNB. Thus, the analog input signals Vip and Vin are sampled to the lower plates of the switch capacitor arrays 110A and 110B. In one embodiment, the capacitors C1A-CNA and C1B-CNB can be metal-oxide-metal (MOM) capacitors, where the upper and lower plates of the MOM capacitor are the positive and negative terminals, and these terminals can be arbitrarily exchanged. The "lower plate" of the switch capacitor arrays 110A and 110B generally refers to the plates where the capacitors C1A-CNA and C1B-CNB are coupled to the switches SW1A-SWNA and SW1B-SWNB.

In the sampling stage PS, under the control signal S1, the switches SW31-SW43 are turned on, allowing the reset of the capacitors Cvint1p, Cvint1n, Cvint3p, and Cvint3n. This action resets the voltage across the capacitors Cvint1p, Cvint1n, Cvint3p, and Cvint3n to 0V. At this point, capacitors Cvint2p, Cvint2n, Cvint4p, and Cvint4n retain the integrated voltage from the previous cycle. The outputs of the amplifiers 131 and 132 are disconnected from the extraction capacitors Cex1p, Cex2p, Cex3p, Cex4p, Cex1n, Cex2n, Cex3n, and Cex4n.

Figure 4:
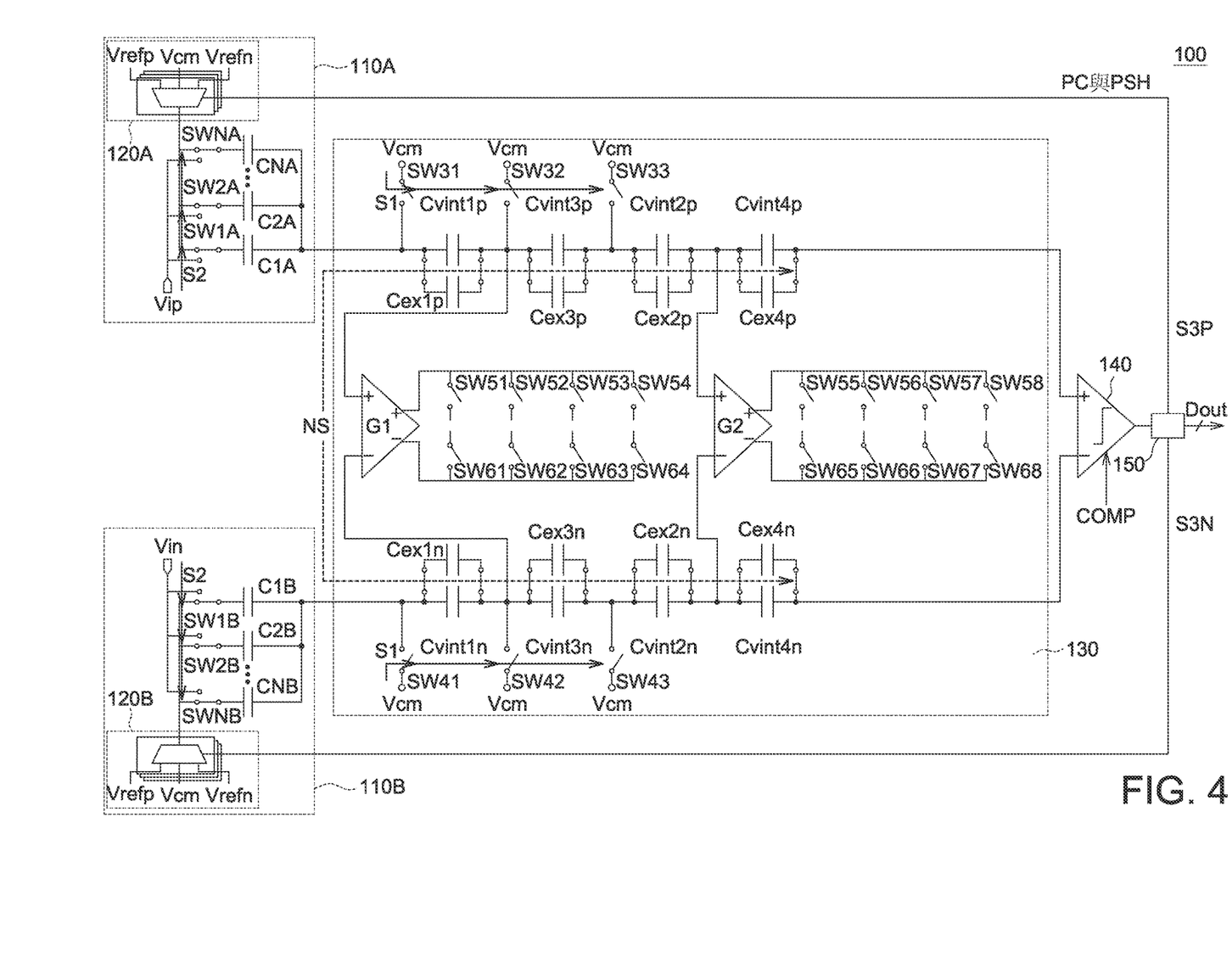
FIG. 4 illustrates the operational schematic diagram of the SAR ADC according to one embodiment of the present disclosure in the conversion stage and sharing stage.

FIG. 4 illustrates the operational schematic diagram of the SAR ADC 100 according to one embodiment of the present disclosure in the conversion stage and sharing stage. In the conversion stage, the comparator performs comparisons. In the sharing stage, the extraction capacitors are coupled in parallel to the integration capacitors for executing charge redistribution.

When the control signal S2 ends (i.e., the end of the sampling stage), under the control of the control signal S1, the switches SW31-SW43 are turned off to route the signals sampled by the lower plates of the switch capacitor arrays 110A and 110B to the upper plates. During the sharing stage, controlled by the control signal NS, the extraction capacitors Cex1p, Cex2p, Cex3p, Cex4p, Cex1n, Cex2n, Cex3n, and Cex4n are coupled in parallel to integration capacitors Cvint1p, Cvint2p, Cvint3p, Cvint4p, Cvint1n, Cvint2n, Cvint3n, and Cvint4n, for executing charge sharing and charge redistribution. The noise shaping circuit 130 shares the charge on the extraction capacitors Cex1p, Cex2p, Cex3p, Cex4p, Cex1n, Cex2n, Cex3n, and Cex4n with the integration capacitors Cvint1p, Cvint2p, Cvint3p, Cvint4p, Cvint1n, Cvint2n, Cvint3n, and Cvint4n to obtain the integration voltages Vint1p, Vint2p, Vint3p, Vint4p, Vint1n, Vint2n, Vint3n, and Vint4n for the current cycle.

In the conversion stage, the comparator 140, controlled by the control signal COMP, performs comparisons, and the logic circuit 150 controls the switch capacitor arrays 110A and 110B to switch output voltages.

After a short period, the voltages on the capacitors Cvint1p, Cvint1n, Cvint2p, Cvint2n, Cvint3p, Cvint3n, Cvint4p, and Cvint4n represent the integration voltages for the current cycle.

When the control signal COMP is enabled, quantization begins. The SAR ADC 100 performs M comparisons (where M is the output bit number of the NS SAR ADC 100). After quantization ends (i.e., the end of the conversion stage), the upper plate voltages of the switch capacitor arrays 110A and 110B represent the residue voltage (Vres) after this quantization.

The quantization is performed using the SAR ADC's quantization process, which involves a plurality of comparisons along with switching the capacitor array to achieve quantization, known as successive approximation.

After quantization, in the n-th cycle, the voltages on the integration capacitors Cvint1p, Cvint1n, Cvint2p, Cvint2n, Cvint3p, Cvint3n, Cvint4p, and Cvint4n can be represented by the following equations (1-1) to (1-4), where Vint1 (n) represents the voltage on the integration capacitor Cvint1p and Cvint1n, and so on. Cex1 represents the capacitance value of the extraction capacitors Cex1p and Cex1n; and Cvint1 represents the capacitance of the integration capacitors Cvint1p and Cvint1n, and so on.

$$Vint1(n) = \frac{Cex1}{Cex1 + Cvint1} * G1^*(Vres(n-1) + Vint1(n-1)) \quad (1-1)$$

$$Vint2(n) = \frac{Cex2}{Cex2 + Cvint2} * G1^*(Vres(n-1) + Vint1(n-1)) + \frac{Cvint2}{Cex2 + Cvint2} * Vint2(n-1) \quad (1-2)$$

$$Vint3(n) = \frac{Cex3}{Cex3 + Cvint3} * G2^*(Vres(n-1) + Vint1(n-1) + Vint2(n-1) + Vint3(n-1)) \quad (1-3)$$

$$Vint4(n) \frac{Cex4}{-Cex4 + Cvint4} * G2^*(Vres(n-1) + Vint1(n-1) + Vint2(n-1) + Vint3(n-1)) + \frac{Cvint4}{Cex4 + Cvint4} * Vint4(n-1) \quad (1-4)$$

The coefficients of the Noise Transfer Function (NTF) are determined by the ratio of the integration capacitors and the amplification factors (G1, G2) of amplifiers 131 and 132.

During the comparison process, the output signals of the switch capacitor arrays 110A and 110B enter the noise shaping circuit 130 and are added to the integration capacitors (Cvint1p, Cvint2p, Cvint3p, Cvint4p, Cvint1n, Cvint2n, Cvint3n, Cvint4n) of the noise shaping circuit 130. In other words, in the conversion stage, the output signal of the switch capacitor array 110A is outputted to the integration capacitors Cint1p, Cint3p, Cint2p, and Cint4p, and the output signal of the switch capacitor array 110B is outputted to the integration capacitors Cint1n, Cint3n, Cint2n, and Cint4n. The two output signals of the noise shaping circuit 130 are output to the comparator 140.

The comparator 140 compares the two output signals of the noise shaping circuit 130. The comparator 140 compares: (1) the input signal Vip plus Vint1p, Vint2p, Vint3p, and Vint4p (referred to as the first sum); and (2) the input signal Vin plus Vint1n, Vint2n, Vint3n, and Vint4n (referred to as the second sum).

The plurality of comparison results of the comparator 140 are input to the logic circuit 150. The logic circuit 150 processes these comparison results and outputs two signals S3P and S3N to control the switch capacitor arrays 110A and 110B based on these comparison results. The switch capacitor arrays 110A and 110B adjust the output voltage based on the control signals S3P and S3N. This process is repeated sequentially. When the number of comparisons by the comparator 140 reaches the bit number of the switch capacitor arrays (i.e., the bit number of the SAR ADC100), the conversion stage PC ends, and the logic circuit 150 outputs the digital output signal.

Figure 5:
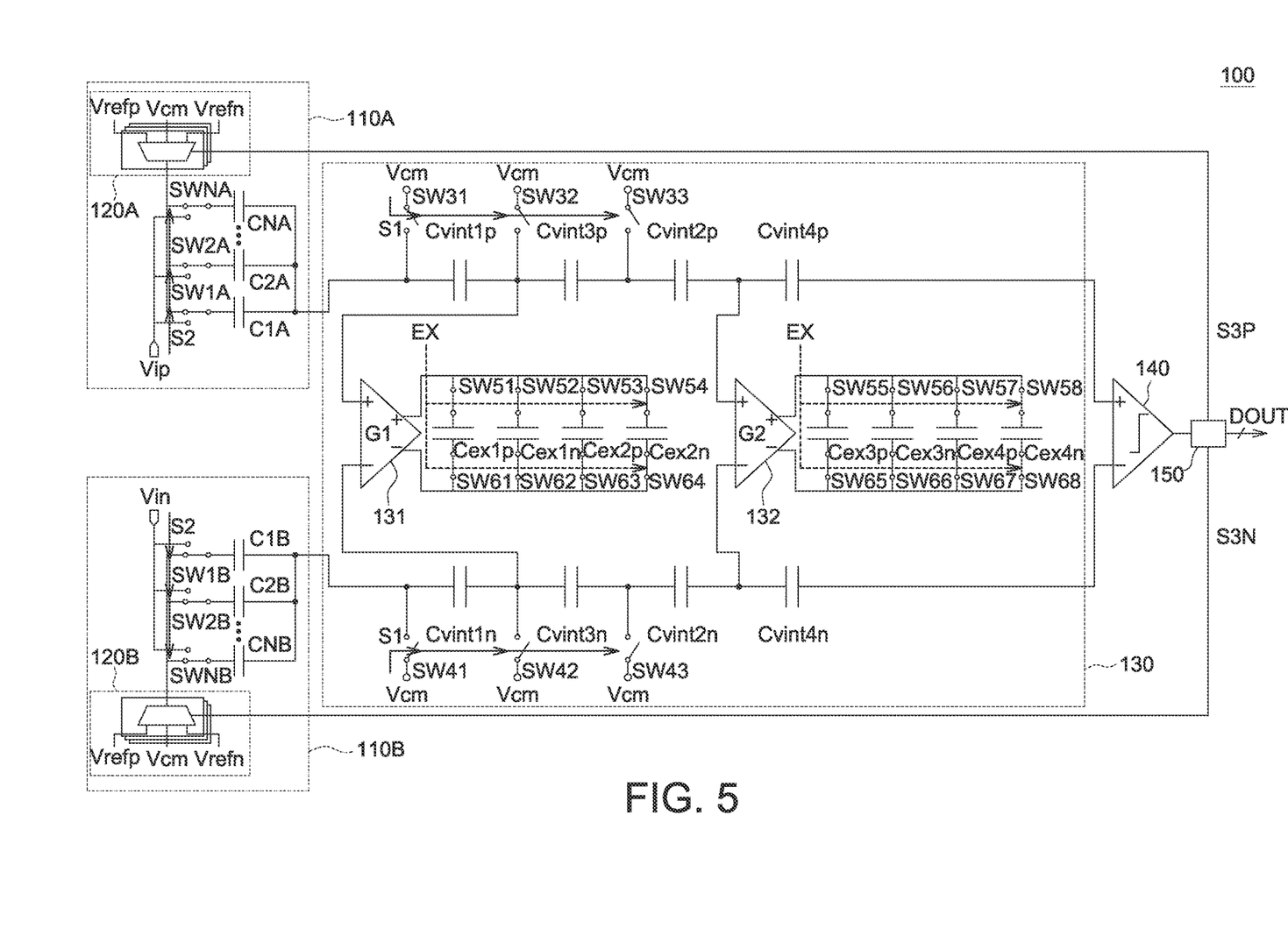
FIG. 5 illustrates the operational schematic diagram of the SAR ADC according to one embodiment of the present disclosure in the extraction stage.

FIG. 5 illustrates the operational schematic diagram of the SAR ADC 100 according to one embodiment of the present disclosure in the extraction stage.

In the extraction stage, under the control signal EX, the voltage Vres+Vint1 on the capacitors Cvint1p and Cvint1n is amplified by the amplifier 131 by a factor of G1 and stored in extraction capacitors Cex1p, Cex2p, Cex1n, and Cex2n.

Additionally, in the extraction stage, under the control signal EX, the voltage Vres+Vint1+Vint2+Vint3 on the integration capacitors Cvint2p, Cvint2n, Cvint3p, Cvint3n, Cvint4p, and Cvint4n is amplified by amplifier 132 by a factor of G2 and stored in extraction capacitors Cex3p, Cex4p, Cex3n, and Cex4n.

The extraction voltages Vex1(n), Vex2(n), Vex3(n), and Vex4(n) on each extraction capacitor can be represented by the following equations (2-1) and (2-2), where Vex1(n) represents the voltage on the extraction capacitors Cex1p and Cex1n, and so on.

$$Vex1(n) = Vex2(n) = G1(Vres(n-1) + Vint1(n-1)) \quad (2-1)$$

$$Vex3(n) = Vex4(n) = G2(Vres(n-1) + Vint1(n-1) + Vint2(n-1) + Vint3(n-1)) \quad (2-2)$$

In the residual extraction stage, the noise shaping circuit 130 uses amplifiers 131/132 and the integration capacitors to apply a gain factor (G1/G2) to the voltages on these integration capacitors after the quantization stage. The processed result is then extracted to the extraction capacitors in the noise shaping circuit 130.

In the extraction stage, the noise shaping circuit 130 uses the amplifier 131 to amplify the output voltage of the integration capacitors Cint1p and Cint1n by a factor of G1 and stores in the extraction capacitors Cex1p, Cex2p, Cex1n, and Cex2n. The amplifier 132 amplifies the output voltage of the integration capacitors Cint2p and Cint2n by a factor of G2 and stores in the extraction capacitors Cex3p, Cex4p, Cex3n, and Cex4n.

Continuing these cycles, the system achieves STF=1 and NTF=1−z$^{-4}$ in the frequency domain. Here, STF represents the Signal Transfer Function, and z is the representation in the z-domain.

Figure 6:
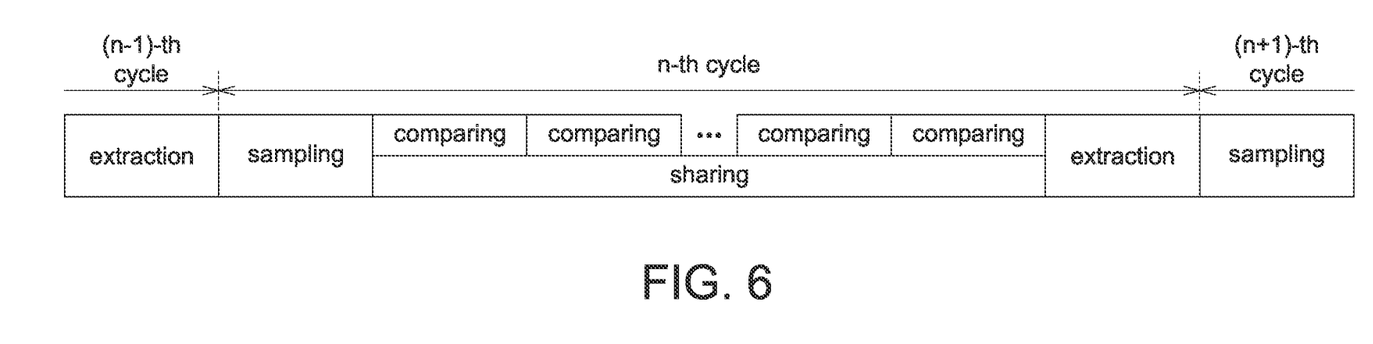
FIG. 6 illustrates a cycle of the SAR ADC according to one embodiment of the present disclosure.

FIG. 6 illustrates a cycle of the SAR ADC 100 according to one embodiment of the present disclosure. As shown in FIG. 6, a cycle includes: the sampling stage, the conversion stage (which includes a plurality of comparison processes) and the sharing stage, and the extraction stage.

Figure 7:
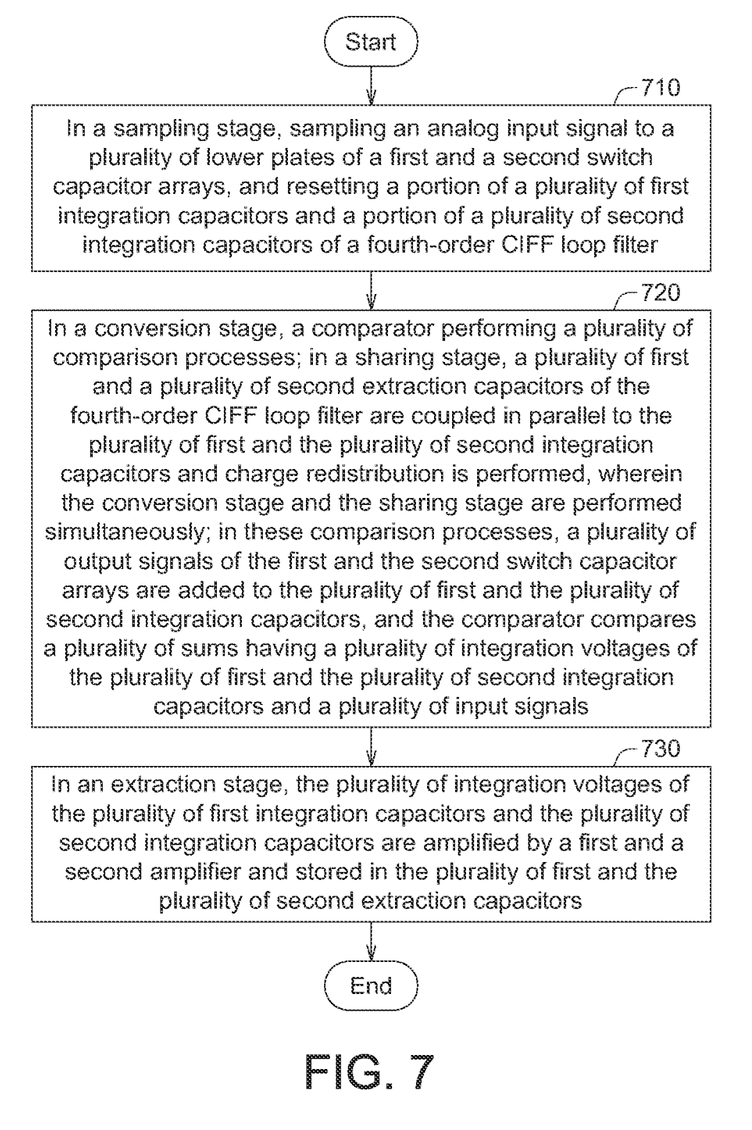
FIG. 7 illustrates a successive approximation register analog-to-digital conversion method according to one embodiment of the present disclosure.

FIG. 7 illustrates a successive approximation register analog-to-digital conversion method according to one embodiment of the present disclosure. The method includes the following steps: (710) in a sampling stage, sampling an analog input signal to a plurality of lower plates of a first and a second switch capacitor arrays and resetting a portion of a plurality of first integration capacitors and a portion of a plurality of second integration capacitors of a fourth-order CIFF loop filter; (720) in a conversion stage, a comparator performing a plurality of comparison processes; in a sharing stage, a plurality of first and a plurality of second extraction capacitors of the fourth-order CIFF loop filter are coupled in parallel to the plurality of first and the plurality of second integration capacitors and charge redistribution is performed, wherein the conversion stage and the sharing stage are performed simultaneously; in these comparison processes, a plurality of output signals of the first and the second switch capacitor arrays are added to the plurality of first and the plurality of second integration capacitors, and the comparator compares a plurality of sums having a plurality of integration voltages of the plurality of first and the plurality of second integration capacitors and a plurality of input signals; and (730) in an extraction stage, the plurality of integration voltages of the plurality of first integration capacitors and the plurality of second integration capacitors are amplified by a first and a second amplifier and stored in the plurality of first and the plurality of second extraction capacitors.

As described above, the present disclosure reveals a SAR ADC with four-order noise shaping. The SAR ADC includes: a plurality of switch capacitor arrays for acquiring an analog input signal; a noise shaping circuit, which is a fourth-order CIFF loop filter having two second-order CIFF loop filters, each of these second-order CIFF loop filters has an amplifier, a plurality of integration capacitors, and a plurality of extraction capacitors, the noise shaping circuit being located after these switch capacitor arrays and before a comparator; and a comparator with two input terminals, each coupled to these integration capacitors, and an output terminal coupled to an input terminal of a logic circuit, the comparator is used to compare a plurality of output signals of the noise shaping circuit.

In one embodiment of the SAR ADC 100, a novel CIFF loop filter technology is mainly utilized. Through the new second-order loop filter architecture of this embodiment, the hardware reuse advantage can be achieved. By serially connecting these second-order loop filters and changing the placement order of down-sampling and the placement order of integration capacitors, the SAR ADC of this embodiment can achieve four-order noise shaping and simplify the timing sequence, combining the benefits of high-order noise shaping and low power consumption.

The SAR ADC of this embodiment has the following technical features. The four-order noise shaping formula having any coefficient is achieved by adjusting the amplifier gain and the ratio of integration capacitors to extraction capacitors.

In one embodiment of the present disclosure, the gain of the amplifiers (131/132) can be any value, and the ratio of integration capacitors to extraction capacitors can also be any ratio.

In the prior art, to reduce the first order output noise, a low-noise amplifier structure must be used, or the output load of the amplifier must be increased, but this will increase power consumption.

Therefore, in one embodiment of the present disclosure, a four-order noise shaping integrator structure is proposed, with a shared amplifier (amplifiers 131 and 132 in FIG. 1) for residual extraction and residual integration. By allowing the first-order extraction capacitors (Cex1p, Cex1n) and the second-order extraction capacitors (Cex2p, Cex2n) to share the amplifier 131, and the third-order extraction capacitors (Cex3p, Cex3n) and the fourth-order extraction capacitors (Cex4p, Cex4n) to share the amplifier 132, the SAR ADC 100 of one embodiment can reduce the capacitors used relative to conventional architectures. Therefore, the SAR ADC 100 of one embodiment can achieve low-power applications.

The high-order noise shaping SAR ADC 100 of one embodiment has several advantages, including but not limited to:

1. It can amplify the integration signal without the need for a plurality of comparators, simplifying the circuit and reducing power consumption.
2. The SAR ADC 100 of one embodiment requires only two amplifiers to achieve the required functionality, but conventional techniques may require four amplifiers. Therefore, the SAR ADC 100 of one embodiment further reduces power consumption and output noise.
3. These amplifiers (131 and 132) can share the output load (including extraction capacitors and additional capacitance loads). This reduces the number of capacitors, reduces power consumption, and reduces additional noise. The connection sequence of integration capacitors can simplify circuit complexity, further achieve a compact CIFF noise shaping structure, and further reduce power consumption. The CIFF noise shaping function of the SAR ADC 100 of one embodiment can achieve a close approximation to the ideal fourth-order CIFF noise transfer function, thereby maintaining excellent noise shaping performance. Therefore, the SAR ADC 100 of one embodiment has good PVT robustness, meaning stable performance can be maintained under different operating conditions.

In summary, the SAR ADC 100 of one embodiment has many advantages, including low power consumption, low noise, simple circuit structure, and good PVT robustness.

In one embodiment of the present disclosure, amplifiers, capacitors, and switches can be used to implement a dynamic integration network.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in a plurality of embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

In summary, although the present invention has been disclosed with reference to embodiments, it is not intended to limit the scope of the invention. Those skilled in the art to which the present invention pertains may make various modifications and improvements within the spirit and scope of the invention. Therefore, the protection scope of the present invention should be determined by the appended claims.

What is claimed is:

1. A successive approximation register analog-to-digital converter comprising:
   a plurality of switch capacitor arrays for acquiring an analog input signal;
   a noise shaping circuit coupled to said switch capacitor arrays, said noise shaping circuit comprising a multi-order Cascade of Integrators with Feed-Forward (CIFF) circuit having a plurality of amplifiers, a plurality of integration capacitors, and a plurality of extraction capacitors;
   a comparator coupled to said noise shaping circuit, said comparator for comparing a plurality of output signals of said noise shaping circuit to generate a plurality of comparison results; and
   a logic circuit coupled to said switch capacitor arrays and said comparator, said logic circuit generating a digital output signal and controlling said switch capacitor arrays based on said comparison results.

2. The successive approximation register analog-to-digital converter according to claim 1, wherein said multi-order CIFF circuit is a fourth-order CIFF circuit having two cascaded second-order CIFF circuits.

3. The successive approximation register analog-to-digital converter according to claim 1, wherein:
   a first switch capacitor array of said switch capacitor arrays comprises a plurality of first capacitors, a plurality of first switches, and a first multiplexer group;
   a second switch capacitor array of said switch capacitor arrays comprises a plurality of second capacitors, a plurality of second switches, and a second multiplexer group;
   said first capacitors and said second capacitors are coupled in series to said first switches and said second switches, respectively;
   said first switches and said second switches selectively input the analog input signal or a plurality of output signals of said first and second multiplexer groups into said first and second capacitors, respectively; and
   each of said first and second multiplexer groups comprises a plurality of multiplexers, said first and second multiplexer groups selecting from a first reference voltage, a second reference voltage, and a common-mode voltage to output to said first and second switches.

4. The successive approximation register analog-to-digital converter according to claim 3, wherein:
   said noise shaping circuit comprises a plurality of first integration capacitors, a plurality of second integration capacitors, a plurality of first extraction capacitors, a plurality of second extraction capacitors, and first and second amplifiers;
   said first integration capacitors are in series;
   said second integration capacitors are in series; and
   said first extraction capacitors are selectively coupled between a positive output terminal and a negative output terminal of said first amplifier, and said second extraction capacitors are selectively coupled between a positive output terminal and a negative output terminal of said second amplifier.

5. The successive approximation register analog-to-digital converter according to claim 4, wherein, in a sampling phase:
   the analog input signal is sampled to a plurality of lower plates of said first and second switch capacitor arrays; and
   a portion of said first integration capacitors and a portion of said second integration capacitors are reset.

6. The successive approximation register analog-to-digital converter according to claim 5, wherein,
   during a conversion phase, the comparator performs a plurality of comparison processes;
   in a sharing phase, said first and second extraction capacitors are coupled in parallel to said first and second integration capacitors, and charge redistribution is performed, with the conversion phase and the sharing phase occurring simultaneously;
   in the comparison processes, a plurality of output signals of said first and second switch capacitor arrays enter said noise shaping circuit and are added to said first and second integration capacitors; and
   the comparator compares a first sum and a second sum, where the first sum is obtained by adding a first analog input signal of the analog input signal to a plurality of first integration voltages of the first integration capacitors, and the second sum is obtained by adding a second analog input signal of the analog input signal to a plurality of second integration voltages of the second integration capacitors.

7. The successive approximation register analog-to-digital converter according to claim 6, wherein, in an extraction phase:
   a voltage of a first part of said first integration capacitors and a voltage of a first part of said second integration capacitors are amplified by said first amplifier and stored on said first extraction capacitors; and
   a voltage of a second part of said first integration capacitors and a voltage of a second part of said second integration capacitors are amplified by said second amplifier and stored on said second extraction capacitors.

8. A successive approximation register analog-to-digital converter comprising:
   a plurality of switch capacitor arrays for acquiring an analog input signal;
   a noise shaping circuit comprising a fourth-order CIFF loop filter having two second-order cascaded CIFF loop filters, wherein in the fourth-order CIFF loop filter, a first order extraction capacitor and a second order extraction capacitor share a first amplifier, and a third order extraction capacitor and a fourth order extraction capacitor share a second amplifier;
   a comparator, two input terminals of the comparator respectively coupled to a plurality of integration capacitors of the fourth-order CIFF loop filter, the comparator comparing a plurality of output signals of the noise shaping circuit to generate a plurality of comparison results, the noise shaping circuit being positioned after said switch capacitor arrays and before said comparator; and a logic circuit, an output terminal of the comparator coupled to an input terminal of the logic circuit, three output terminals of the logic circuit respectively coupled to said switch capacitor arrays for generating a digital output signal, and the logic circuit generating the digital output signal based on the comparison results of said comparator to control said switch capacitor arrays.

9. The successive approximation register analog-to-digital converter according to claim 8, wherein, in a sampling phase:
the analog input signal is sampled to a plurality of lower plates of said switch capacitor arrays; and
a portion of said plurality of integration capacitors of the fourth-order CIFF loop filter are reset.

10. The successive approximation register analog-to-digital converter according to claim 9, wherein,
in a conversion phase, the comparator performs comparisons;
in a sharing phase, said first order extraction capacitor, said second order extraction capacitor, said third order extraction capacitor, and said fourth order extraction capacitor are coupled in parallel to said plurality of integration capacitors of the fourth-order CIFF loop filter for performing charge sharing and redistribution, wherein the conversion phase and the sharing phase occurring simultaneously;
the analog input signal sampled by the plurality of lower plates of said switch capacitor arrays is pushed to a plurality of upper plates of said switch capacitor arrays;
in the conversion phase, the comparator performs comparisons, and the logic circuit controls said switch capacitor arrays;
after the conversion phase ends, a plurality of voltages of the plurality of upper plates of said switch capacitor arrays is a residual voltage after the conversion phase;
a noise transfer function of the fourth-order CIFF loop filter is determined by a capacitance ratio of said plurality of integration capacitors and amplification ratios of the first and second amplifiers; and
when a comparison number of the comparator reaches a bit number of the successive approximation register analog-to-digital converter, the conversion phase ends, and the logic circuit outputs the digital output signal.

11. The successive approximation register analog-to-digital converter according to claim 10, wherein, in an extraction phase:
the noise shaping circuit uses said first and second amplifiers and said plurality of integration capacitors to amplify a plurality of integration voltages of said plurality of integration capacitors by a gain factor, and extracts a processing result to said first order extraction capacitor, said second order extraction capacitor, said third order extraction capacitor, and said fourth order extraction capacitor.

12. A method for successive approximation register analog-to-digital conversion, comprising:
in a sampling phase, sampling an analog input signal to a plurality of lower plates of a first and a second switch capacitor arrays, and resetting a portion of a plurality of first integration capacitors and a portion of a plurality of second integration capacitors of a fourth-order CIFF loop filter;
in a conversion phase, performing a plurality of comparison processes by a comparator;
in a sharing phase, coupling a plurality of first extraction capacitors and a plurality of second extraction capacitors of the fourth-order CIFF loop filter in parallel to the first integration capacitors and the second integration capacitors for charge redistribution, wherein the conversion phase and the sharing phase occurring simultaneously;
in the comparison processes, adding a plurality of output signals of the first and second switch capacitor arrays to the first and the second integration capacitors; comparing a plurality of summing having a plurality of integration voltages of the first and the second integration capacitors and a plurality of input signals by the comparator; and
in an extraction phase, amplifying the integration voltages of the plurality of first integration capacitors and the plurality of second integration capacitors using a first and a second amplifier, and storing on the first and the second extraction capacitors.

* * * * *